(12) United States Patent
Kasai

(10) Patent No.: US 10,739,538 B2
(45) Date of Patent: Aug. 11, 2020

(54) LIGHT GUIDING DEVICE, LASER MODULE, AND METHOD FOR MANUFACTURING LIGHT GUIDING DEVICE

(71) Applicant: FUJIKURA LTD., Tokyo (JP)

(72) Inventor: Yohei Kasai, Chiba (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 16/482,042

(22) PCT Filed: Sep. 8, 2017

(86) PCT No.: PCT/JP2017/032525
§ 371 (c)(1),
(2) Date: Jul. 30, 2019

(87) PCT Pub. No.: WO2018/142657
PCT Pub. Date: Aug. 9, 2018

(65) Prior Publication Data
US 2020/0064567 A1 Feb. 27, 2020

(30) Foreign Application Priority Data
Jan. 31, 2017 (JP) .................. 2017-015860

(51) Int. Cl.
*G02B 6/42* (2006.01)
*G02B 7/02* (2006.01)
(Continued)

(52) U.S. Cl.
CPC ......... *G02B 6/4206* (2013.01); *G02B 6/4214* (2013.01); *G02B 7/021* (2013.01);
(Continued)

(58) Field of Classification Search
CPC .... G02B 6/4206; G02B 6/4214; G02B 7/021; G02B 7/025; G02B 27/30; H01S 5/02284;
(Continued)

(56) References Cited

U.S. PATENT DOCUMENTS

| 5,793,792 A | 8/1998 | Baxter et al. |
| 6,287,401 B1 | 9/2001 | Anderson et al. |

(Continued)

FOREIGN PATENT DOCUMENTS

| CN | 104704410 A | 6/2015 |
| CN | 106104343 A | 11/2016 |

(Continued)

OTHER PUBLICATIONS

International Preliminary Report on Patentability issued in corresponding International Patent Application No. PCT/JP2017/032525, dated Aug. 15, 2019 (12 pages).

(Continued)

*Primary Examiner* — Daniel Petkovsek
(74) *Attorney, Agent, or Firm* — Osha Liang LLP

(57) ABSTRACT

A light-guiding device includes: a group of mirrors that converts a first beam bundle including a plurality of first laser beams into a second beam bundle including a plurality of second laser beams; a group of collimating lenses disposed at a stage previous to the group of mirrors and including collimating lenses that each collimate a divergence, in an F-axis direction, of a corresponding one of the plurality of first laser beams; and a converging lens disposed at a stage subsequent to the group of mirrors, the converging lens converges the second beam bundle by refracting each of the plurality of second laser beams.

11 Claims, 9 Drawing Sheets

(51) Int. Cl.
*G02B 27/30* (2006.01)
*H01S 5/022* (2006.01)
*H01S 5/40* (2006.01)

(52) U.S. Cl.
CPC ............ *G02B 7/025* (2013.01); *G02B 27/30* (2013.01); *H01S 5/02284* (2013.01); *H01S 5/02288* (2013.01); *H01S 5/02292* (2013.01); *H01S 5/4012* (2013.01)

(58) Field of Classification Search
CPC . H01S 5/02288; H01S 5/02292; H01S 5/4012
See application file for complete search history.

(56) References Cited

U.S. PATENT DOCUMENTS

| | | | | |
|---|---|---|---|---|
| 7,830,608 | B2 * | 11/2010 | Hu ..................... | G02B 27/0944 359/618 |
| 9,864,142 | B2 * | 1/2018 | Sakamoto ................ | G02B 6/43 |
| 10,473,869 | B2 * | 11/2019 | Kasai ................... | G02B 6/4206 |
| 2005/0069255 | A1 * | 3/2005 | Nishimura ............ | G02B 6/4206 385/31 |
| 2011/0032962 | A1 | 2/2011 | Singer et al. | |
| 2015/0219890 | A1 * | 8/2015 | Kumeta ................ | H01S 5/0071 359/226.1 |
| 2015/0280404 | A1 * | 10/2015 | Kasai ..................... | G02B 27/10 385/33 |
| 2017/0010417 | A1 | 1/2017 | Sakamoto et al. | |

FOREIGN PATENT DOCUMENTS

| | | | |
|---|---|---|---|
| JP | H7199117 A | 8/1995 | |
| JP | H10107359 A | 4/1998 | |
| JP | H11153762 A | 6/1999 | |
| JP | 3717650 B2 | 11/2005 | |
| JP | 200725433 A | 2/2007 | |
| JP | 2010276860 A * | 12/2010 | ............ G02B 26/10 |
| JP | 2014126852 A | 7/2014 | |
| JP | 2015148810 A | 8/2015 | |
| JP | 2015187623 A | 10/2015 | |
| JP | 2016115720 A | 6/2016 | |
| JP | 2016-134535 A | 7/2016 | |
| JP | 2016143704 A | 8/2016 | |
| WO | 2014034428 A1 | 3/2014 | |

OTHER PUBLICATIONS

International Search Report issued in corresponding International Patent Application No. PCT/JP2017/032525, dated Nov. 21, 2017 (3 pages).

Notification of Reasons for Refusal issued in corresponding Japanese Patent Application No. 2017-557224, dated May 15, 2018 (3 pages).

Extended European Search Report issued in corresponding European Patent Application No. 17894782.6, dated Dec. 5, 2019 (10 pages).

* cited by examiner

LD = LD1-LD10, C = C1-C10, P = P1-P10, M = M1-M10

LD = LD1–LD10, C = C1–C10, P = P1–P10, M = M1–M10

PRIOR ART

PRIOR ART

LD = LD1–LD10, C = C1–C10, P = P1–P10, M = M1–M10

LIGHT GUIDING DEVICE, LASER MODULE, AND METHOD FOR MANUFACTURING LIGHT GUIDING DEVICE

TECHNICAL FIELD

One or more embodiments of the present invention relate to a light-guiding device which guides a beam bundle. One or more embodiments of the present invention also relate to a laser module including the light-guiding device and a manufacturing method for manufacturing the light-guiding device.

BACKGROUND

A laser module including a plurality of laser diodes is widely used as a light source for outputting a laser beam. Documents disclosing such a laser module include, for example, Patent Literature 1.

Patent Literature 1 discloses a laser module 10 which, as illustrated in FIG. 8, includes (1) a group of laser diodes LD that generates a first beam bundle consisting of laser beams whose optical axes are aligned parallel to one another in a first plane and whose F axes are orthogonal to the first plane, (2) a group of collimating lenses C that collimates a divergence, in an F-axis direction, of each of the laser beams constituting the first beam bundle generated by the group of laser diodes LD, (3) a group of mirrors M that converts the first beam bundle, which is constituted by the laser beams the divergence of each of which in the F-axis direction has been collimated by the group of collimating lenses C, into a second laser beam bundle consisting of laser beams whose optical axes are aligned parallel to one another in a second plane and whose F axes are parallel to the second plane, (4) a converging lens L that converges the second beam bundle by refracting, in the second plane, the laser beams constituting the second beam bundle obtained with use of the group of mirrors M, and (5) an optical fiber OF that receives the second beam bundle converged by the converging lens L.

Each double mirror Mi constituting the group of mirrors M is constituted, as illustrated in FIG. 9, by a first mirror Mi1 that reflects each laser beam constituting the first beam bundle and a second mirror Mi2 that reflects the laser beam reflected by the first mirror. In the laser module 10, (a) adjusting an orientation of the first mirror Mi1 of each double mirror Mi (causing minute rotation of the first mirror Mi1 around a z axis as a rotation axis) allows a traveling direction of a corresponding laser beam of the second beam bundle to be changed in an elevation angle direction and (b) adjusting an orientation of the second mirror Mi2 of each double mirror Mi (causing minute rotation of the second mirror Mi2 around a z axis as a rotation axis) allows a traveling direction of a corresponding laser beam of the second beam bundle to be changed in an azimuth direction. Accordingly, even in a case where traveling directions of the laser beams constituting the first beam bundle that enters the group of mirrors M vary, adjusting the orientations of the first mirror Mi1 and the second mirror Mi2 of each double mirror Mi allows obtaining a second beam bundle consisting of laser beams that do not vary in traveling direction.

However, in a case where the second beam bundle is a parallel bundle (a set of laser beams whose optical axes are parallel to one another) at a portion where the second beam bundle has not been converged by the converging lens L as illustrated in FIG. 8, laser beams constituting the second beam bundle at a portion where the second beam bundle has been converged by the converging lens L do not intersect with one another, as illustrated in (a) of FIG. 10. This is because the converging lens L has spherical aberration. This makes it difficult to cause all of the laser beams constituting the second beam bundle to enter the optical fiber OF. Accordingly, an efficiency of coupling between the group of laser diodes LD and the optical fiber OF decreases.

Technologies that address the above situation are disclosed in documents including, for example, Patent Literature 2. Patent Literature 2 discloses the following matters. Specifically, in a case where, as illustrated in (b) of FIG. 10, a beam bundle is a convergent bundle (a set of laser beams whose optical axes are spaced apart from one another by a distance that decreases as a distance from a light source increases) at a portion where the beam bundle has not been converged by a converging lens, the laser beams constituting the beam bundle at a portion where the beam bundle has been converged by the converging lens successfully intersect with one another at a single point. Further, in a case where, as illustrated in (c) of FIG. 10, a beam bundle is a divergent bundle (a set of laser beams whose optical axes are spaced apart from one another by a distance that increases as a distance from a light source increases) at a portion where the beam bundle has not been converged by a converging lens, the laser beams constituting the beam bundle at a portion where the beam bundle has been converged by the converging lens successfully intersect with one another at a single point.

A laser module that utilizes the technology disclosed in Patent Literature 2 is disclosed in documents including, for example, Patent Literature 3. Patent Literature 3 discloses a laser module 20 which, as illustrated in FIG. 11, is obtained by adjusting an orientation of the second mirror Mi2 of each double mirror Mi of the laser module 10 of Patent Literature 1 so that the second beam bundle is a convergent bundle at a portion where the second beam bundle has not been converged by the converging lens L. This allows laser beams constituting the second beam bundle at a portion where the second beam bundle has been converged by the converging lens L to intersect with one another at a single point. Accordingly, it becomes possible to increase an efficiency of coupling between the group of laser diodes LD and the optical fiber OF as compared with the laser module 10 disclosed in Patent Literature 1.

Patent Literatures

Patent Literature 1
International Publication No. 2014/034428
Patent Literature 2
Japanese Patent Application Publication, *Tokukaihei*, No. 7-199117
Patent Literature 3
Japanese Patent Application Publication, *Tokukai*, No. 2014-126852

The laser module 20 disclosed in Patent Literature 3 is discussed below.

Specifically, each collimating lens Ci constituting the group of collimating lenses C of the laser module 20 disclosed in Patent Literature 3 is fixed to a substrate B with use of a supporting column Pi as illustrated in FIG. 12. To do so, a resin R1 is used to bond and fix a bottom surface of the supporting column Pi to an upper surface of the substrate B and a resin R2 is used to bond and fix a side surface of the collimating lens Ci to a side surface of the supporting column Pi. These resins R1 and R2 expand by absorbing water.

In a case where the resin R1 used for bonding the substrate B and the supporting column Pi to each other expands by absorbing water, the supporting column Pi is displaced in a direction away from the substrate B as illustrated in FIG. 12. As a result, the collimating lens Ci is displaced in a direction away from the substrate B, i.e., in a direction parallel to an F axis of a laser beam entering the collimating lens Ci. In a case where the resin R2 (in particular, a fillet portion attached to a lower surface of the collimating lens Ci) used for bonding the supporting column Pi and the collimating lens Ci to each other expands by absorbing water, the collimating lens Ci is displaced in a direction away from the substrate B, i.e., in a direction parallel to an F axis of a laser beam entering the collimating lens Ci as illustrated in FIG. 12.

Then, as illustrated in FIG. 13, a traveling direction of each laser beam constituting the first beam bundle entering the group of mirrors M changes in an elevation angle direction. As a result, as illustrated in FIG. 13, a traveling direction of each laser beam constituting the second beam bundle emitted from the group of mirrors M changes in an azimuth direction. In FIG. 13, a solid line indicates an optical axis of a laser beam whose traveling direction has not changed and a broken line indicates an optical axis of a laser beam whose traveling direction has changed.

In a case where traveling directions of laser beams constituting the second beam bundle at a portion where the second beam bundle has not been converged by the converging lens L change as described above, traveling directions of laser beams constituting the second beam bundle at a portion where the second beam bundle has been converged by the converging lens L change as illustrated in FIG. 14. This causes a displacement of an intersection at which the laser beams intersect with one another. Accordingly, an efficiency of coupling between the group of laser diodes L and the optical fiber OF decreases. For example, as illustrated in FIG. 14, in a case where an optical axis of the converging lens L and a center axis of the optical fiber OF coincide with each other and the displacement of the intersection is greater than a core diameter, it becomes impossible to cause the laser beams to enter a core of the optical fiber OF.

Note that although the description above discussed a situation that may be caused in a case where a resin used for bonding and fixing a collimating lens has expanded by absorbing water, it goes without saying that the same situation may be caused also in a case where the resin has expanded due to a reason (e.g., heating) other than water absorption.

SUMMARY

One or more embodiments of the present invention provide a laser module that allows a decrease in efficiency of coupling between a group of laser diodes and an optical fiber, which decrease may be caused in a case where a resin for fixing a collimating lens has expanded, to be reduced as compared with a conventional laser module. One or more embodiments of the present invention provide a light-guiding device that contributes to provision of the laser module.

A light-guiding device in accordance with one or more embodiments of the present invention is a light-guiding device, including: a group of mirrors that converts a first beam bundle consisting of a plurality of laser beams into a second beam bundle consisting of a plurality of laser beams; a group of collimating lenses provided at a stage previous to the group of mirrors and consisting of collimating lenses each of which collimates a divergence, in an F-axis direction, of a corresponding one of the plurality of laser beams constituting the first beam bundle; and a converging lens provided at a stage subsequent to the group of mirrors, the converging lens converging the second beam bundle by refracting each of the plurality of laser beams constituting the second beam bundle, a traveling direction of each of laser beams constituting the second beam bundle at a portion where the second beam bundle has not been converged by the converging lens being given an offset so as to be offset from a reference direction so as to compensate for a change in the traveling direction caused by an expansion of a resin for fixing the collimating lenses, the reference direction being such a traveling direction of the each of the laser beams constituting the second beam bundle at the portion where the second beam bundle has not been converged by the converging lens as to cause a plurality of laser beams constituting the second beam bundle at a portion where the second beam bundle has been converged by the converging lens to form a single intersection on an optical axis of the converging lens.

A method, in accordance with one or more embodiments of the present invention, for manufacturing a light-guiding device is a method for manufacturing a light-guiding device, the light-guiding device including: a group of mirrors that converts a first beam bundle consisting of a plurality of laser beams into a second beam bundle consisting of a plurality of laser beams; a group of collimating lenses provided (disposed) at a stage previous to the group of mirrors and consisting of collimating lenses each of which collimates a divergence, in an F-axis direction, of a corresponding one of the plurality of laser beams constituting the first beam bundle; and a converging lens provided (disposed) at a stage subsequent to the group of mirrors, the converging lens converging the second beam bundle by refracting each of the plurality of laser beams constituting the second beam bundle, the method including the step of: giving an offset to a traveling direction of each of laser beams constituting the second beam bundle at a portion where the second beam bundle has not been converged by the converging lens, so that the traveling direction is offset from a reference direction so as to compensate for a change in the traveling direction caused by an expansion of a resin for fixing the collimating lenses, the reference direction being such a traveling direction of the each of the laser beams constituting the second beam bundle at the portion where the second beam bundle has not been converged by the converging lens as to cause a plurality of laser beams constituting the second beam bundle at a portion where the second beam bundle has been converged by the converging lens to form a single intersection on an optical axis of the converging lens.

In a case where a light-guiding device in accordance with one or more embodiments of the present invention is used for guiding a beam bundle, outputted from a group of laser diodes, to an optical fiber, it is possible to allow a decrease in efficiency of coupling between the group of laser diodes and the optical fiber, which decrease may be caused when a resin for fixing a collimating lens has expanded, to be reduced as compared with a conventional laser module. Further, in a case where a light-guiding device in accordance with one or more embodiments of the present invention is used for guiding a beam bundle, outputted from a group of laser diodes, to an optical fiber, it is possible to provide a laser module that provides the above effect.

Figure 1:
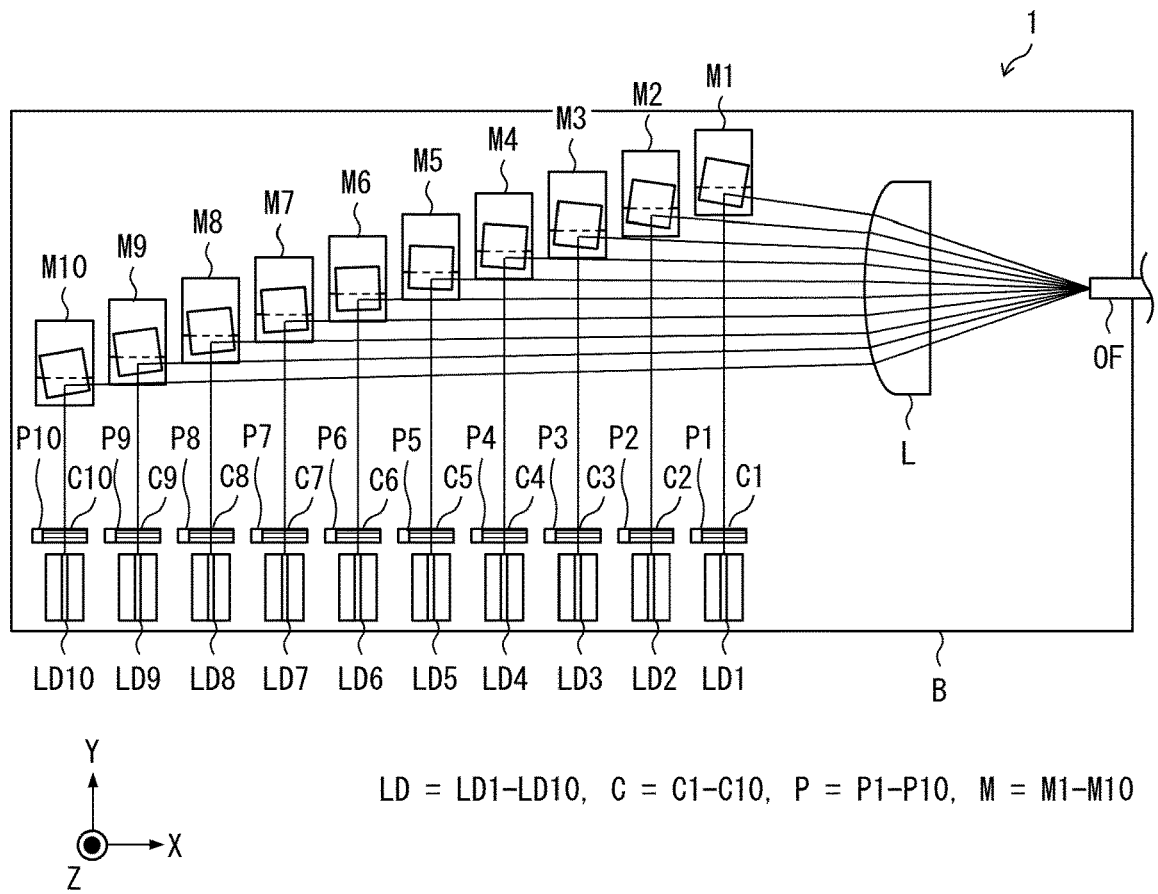
FIG. 1 is a plan view illustrating a configuration of a laser module in accordance with one or more embodiments of the present invention.
Figure 6:
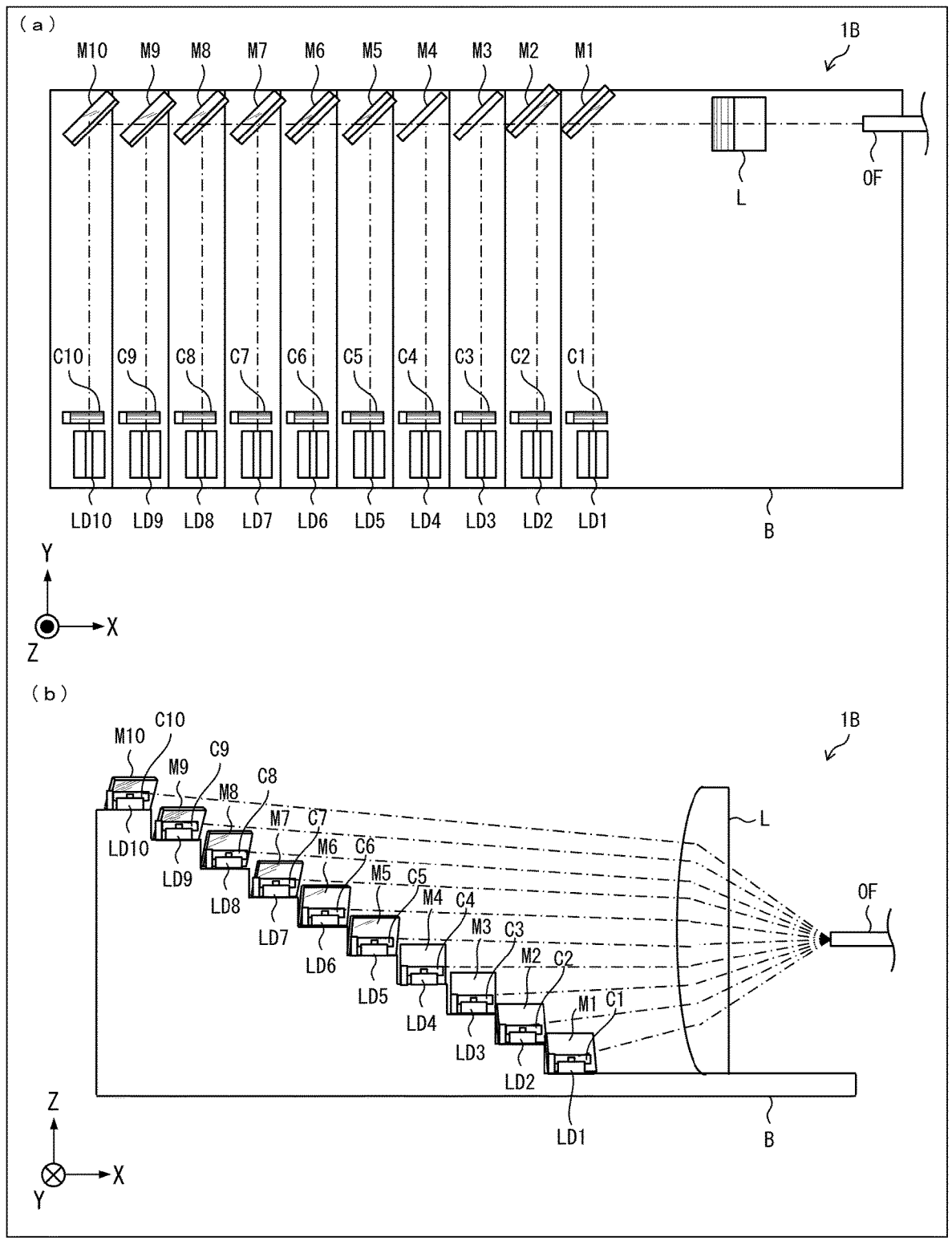

(a) of FIG. 6 is a plan view illustrating Modified Example 2 of the laser module illustrated in FIG. 1, and (b) of FIG. 6 is a side view of Modified Example 2 of the laser module illustrated in FIG. 1 in accordance with one or more embodiments of the present invention.

Figure 7:
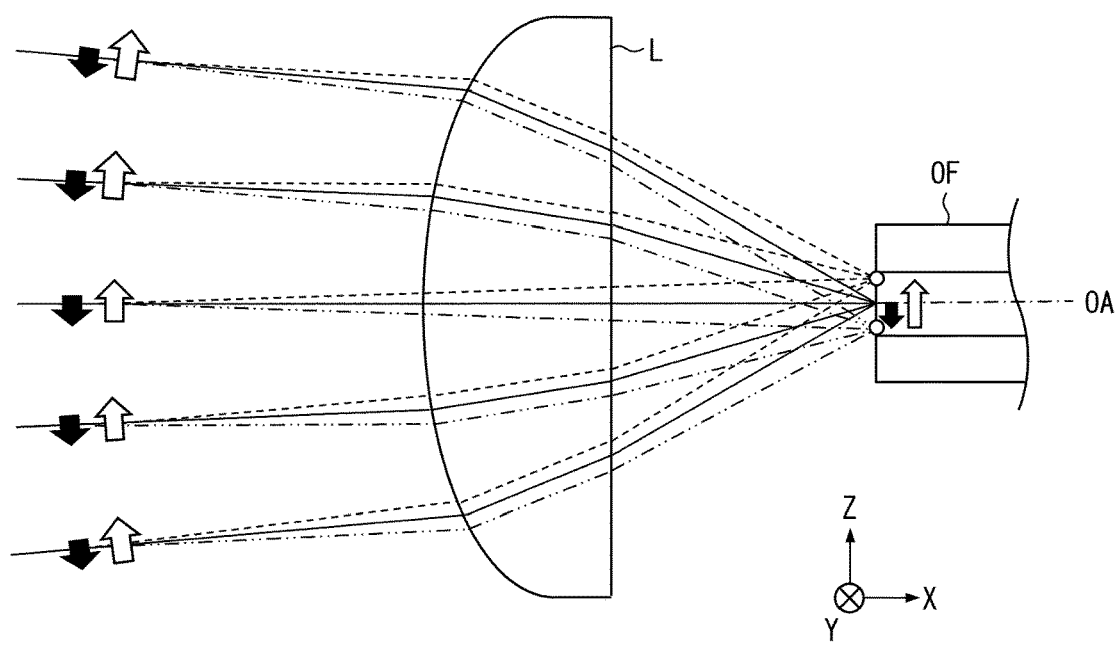

FIG. 7 is a side view of a collimating lens and an optical fiber which are included in the laser module illustrated in FIG. 6 in accordance with one or more embodiments of the present invention.

Figure 8:
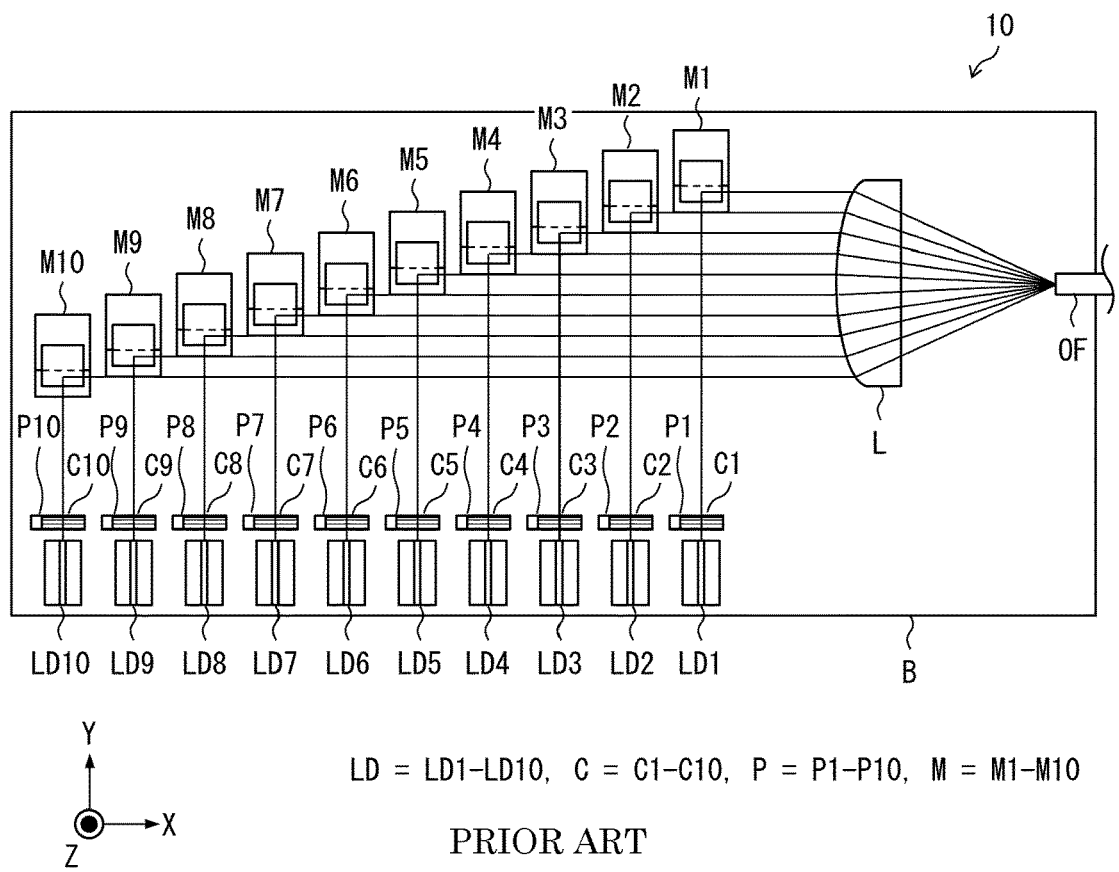

FIG. 8 is a plan view illustrating a configuration of a conventional laser module.

Figure 9:
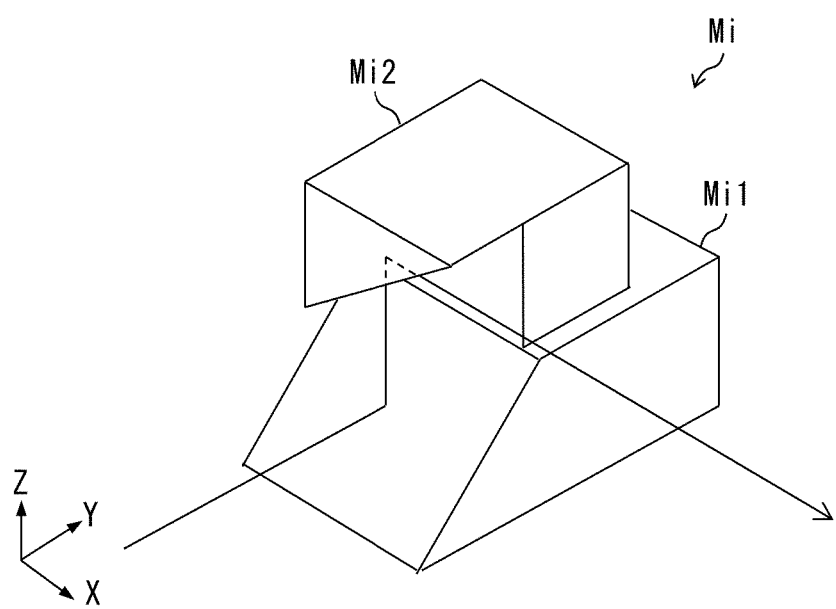

FIG. 9 is a perspective view illustrating a configuration of a double mirror included in a conventional laser module and in a laser module in accordance with one or more embodiments of the present invention.

Figure 10:
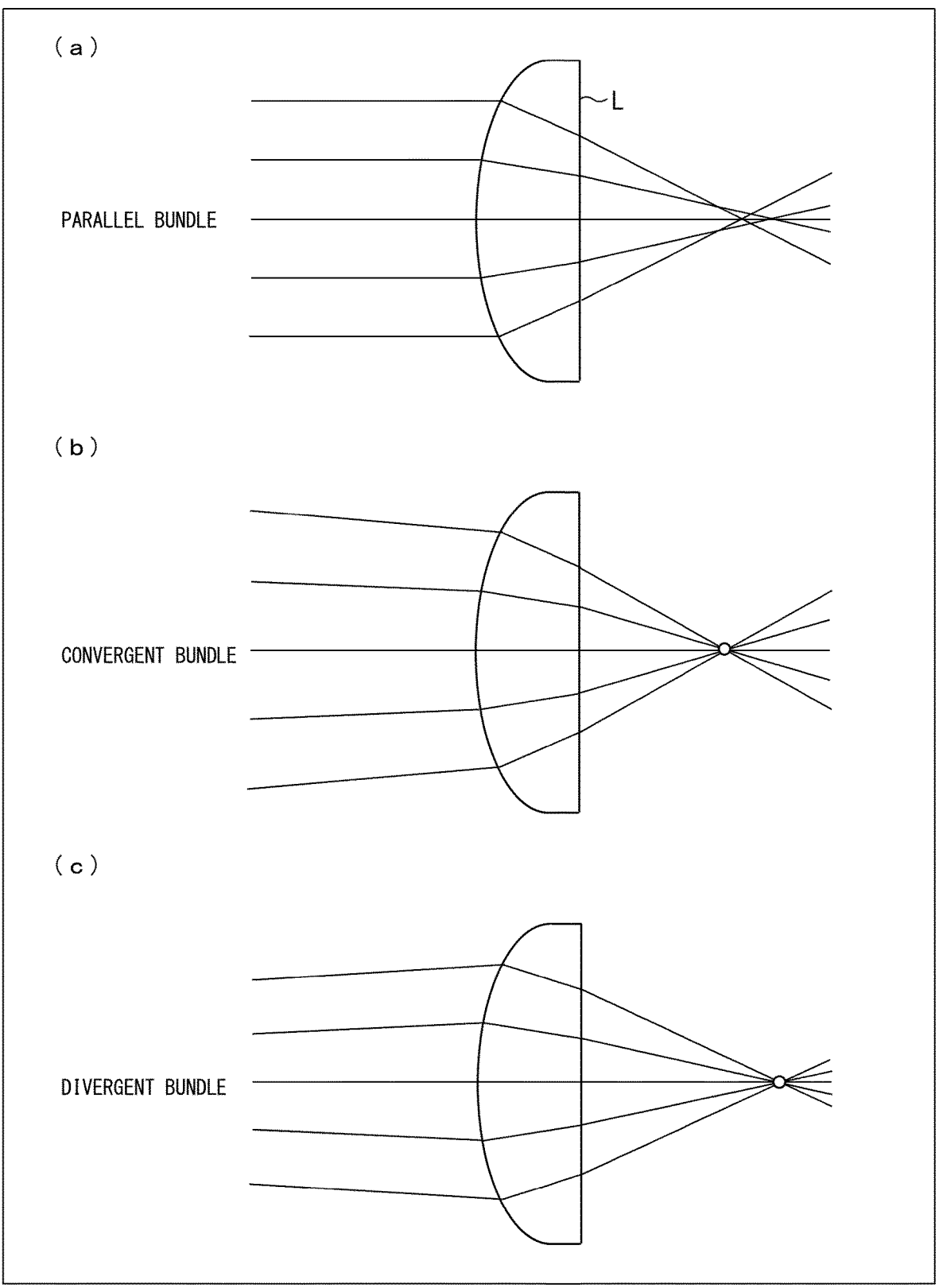

FIG. 10 is a plan view illustrating optical paths of a beam bundle entering a collimating lens in accordance with one or more embodiments of the present invention. (a) of FIG. 10 illustrates optical paths corresponding to a case in which the beam bundle entering the collimating lens is a parallel bundle. (b) of FIG. 10 illustrates optical paths corresponding to a case in which the beam bundle entering the collimating lens is a convergent bundle. (c) of FIG. 10 illustrates optical paths corresponding to a case in which the beam bundle entering the collimating lens is a divergent bundle.

Figure 11:
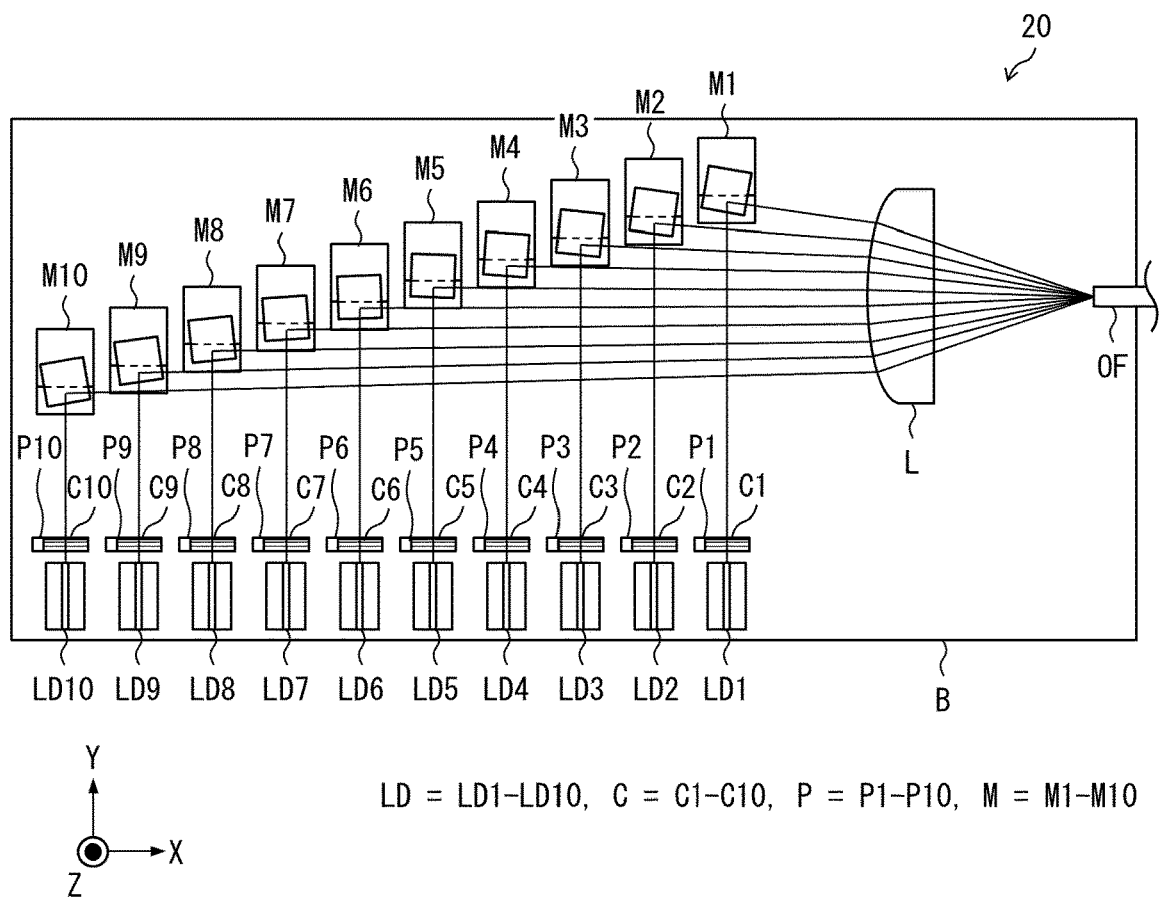

FIG. 11 is a plan view illustrating a configuration of a conventional laser module.

Figure 12:
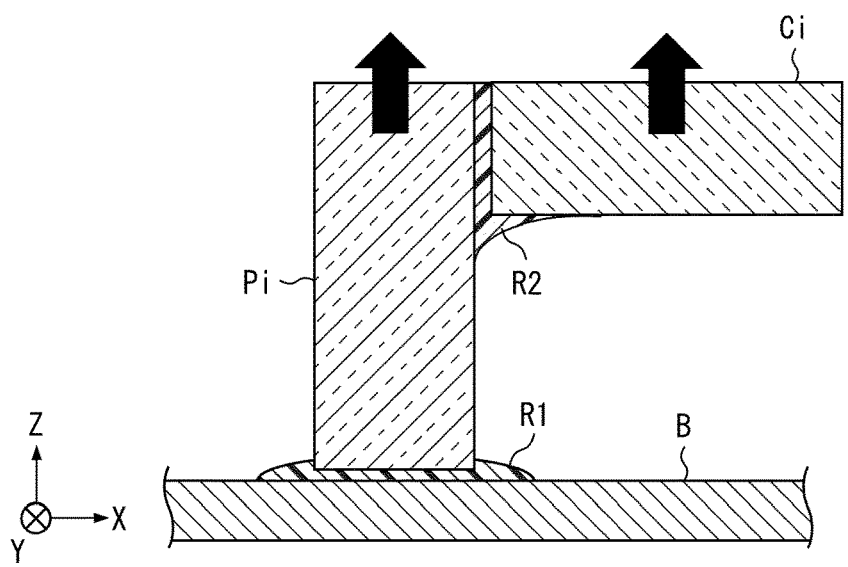

FIG. 12 is a cross-sectional view of a collimating lens, a supporting column, and a substrate B which are included in a conventional laser module and in a laser module in accordance with one or more embodiments of the present invention.

Figure 13:
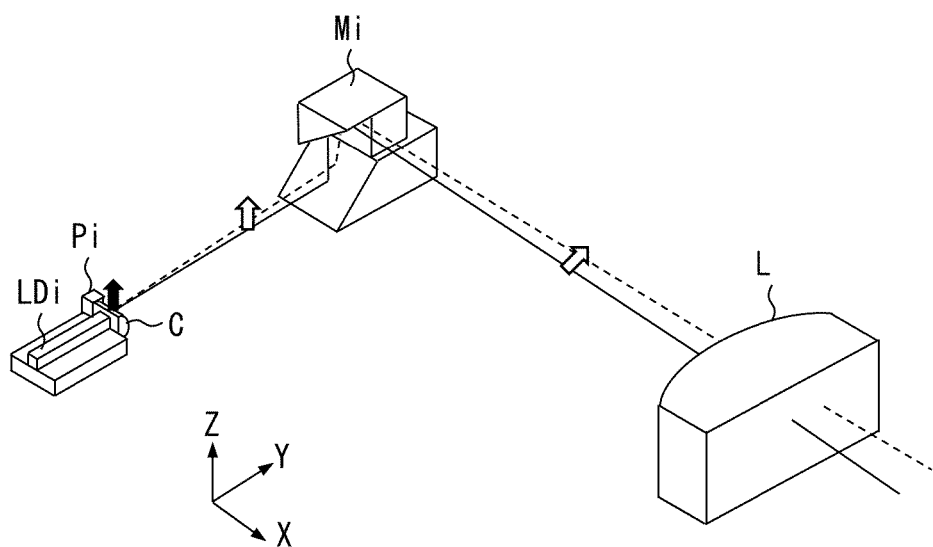

FIG. 13 is a perspective view of a laser diode, a collimating lens, a supporting column, a double mirror, and a converging lens, which are included in the laser module illustrated in FIG. 11, in accordance with one or more embodiments of the present invention.

Figure 14:
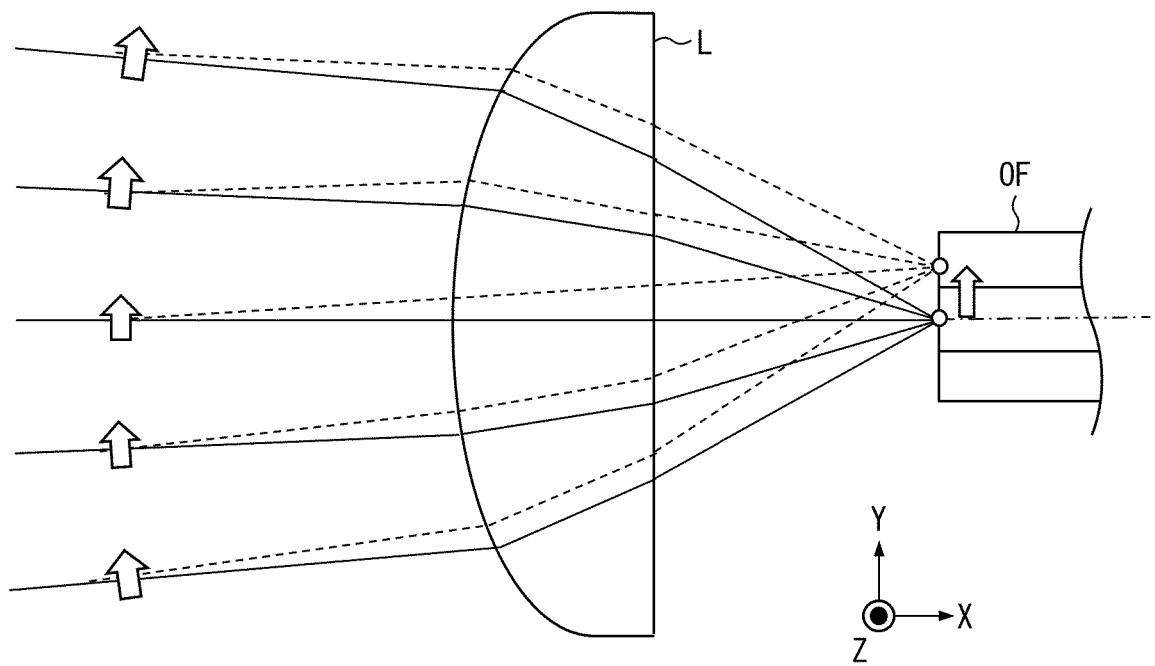

FIG. 14 is a plan view of a converging lens and an optical fiber which are included in the laser module illustrated in FIG. 11 in accordance with one or more embodiments of the present invention.

DETAILED DESCRIPTION

Configuration of Laser Module

The following description will discusses, with reference to FIG. 1, a configuration of a laser module 1 in accordance with one or more embodiments of the present invention. FIG. 1 is a plan view illustrating a configuration of the laser module 1.

As illustrated in FIG. 1, the laser module 1 includes a single substrate B, a group of laser diodes LD consisting of n laser diodes LD1 through LDn, a group of collimating lenses C consisting of n collimating lenses C1 through Cn, a group of supporting columns P consisting of n supporting columns P1 through Pn, a group of mirrors M consisting of n double mirrors M1 through Mn, a single converging lens L, and a single optical fiber OF. Note that n is any natural number of not less than 2. In one or more embodiments, n=10. A portion of the laser module 1 which portion excludes the group of laser diodes LD and the optical fiber OF is referred to as a light-guiding device.

A laser diode LDi (i is a natural number of not less than 1 and not more than n) is a configuration for generating a laser beam. In one or more embodiments, the laser diodes LD1 through LDn are each a laser diode that is mounted on the substrate B so that, in a coordinate system illustrated in FIG. 1, an active layer is parallel to an x-y plane and an exit end surface is parallel to a z-x plane. The laser diode LDi outputs a laser beam that travels in a traveling direction coinciding with a y-axis positive direction and has an F (Fast) axis parallel to a z axis and an S (Slow) axis parallel to an x axis. The laser diodes LD1 through LDn are provided so that the exit end surface of each laser diode LDi is located on a straight line parallel to the x axis. Laser beams outputted from the respective laser diodes LD1 through LDn constitute a parallel bundle (hereinafter, "first beam bundle") consisting of laser beams whose optical axes are aligned in a plane (hereinafter, "first plane") parallel to the x-y plane and whose F axes are parallel to the z axis (orthogonal to the first plane). Note that the first plane is a virtual plane containing the optical axes of the laser beams outputted from the laser diodes LD1 through LDn, and is not a physical entity.

On an optical path of the laser beam generated by the laser diode LDi, a collimating lens Ci is provided. The collimating lens Ci is a configuration for collimating a divergence, in an F-axis direction, of a laser beam outputted from a corresponding laser diode LDi among the laser beams constituting the first beam bundle. In one or more embodiments, the collimating lenses C1 through Cn are each a plano-convex cylindrical lens that is provided so that, in the coordinate system illustrated in FIG. 1, a flat surface (incident surface) faces a y-axis negative direction, a curved surface (exit surface) faces the y-axis positive direction, and an outer edge of a cross section parallel to a y-z plane which outer edge is on a y-axis positive direction side forms an arc.

At a side of the collimating lens Ci, a supporting column Pi is provided. The supporting column Pi is a configuration for supporting a corresponding collimating lens Ci. In one or more embodiments, the supporting columns P1 through Pn are each a glass block that has a rectangular parallelepiped shape and is provided so that, in the coordinate system illustrated in FIG. 1, four side surfaces of the glass block face an x-axis positive direction, the y-axis positive direction, an x-axis negative direction, and the y-axis negative direction, respectively, and an upper surface and a lower surface of the glass block face a z-axis positive direction and a z-axis negative direction, respectively. As illustrated in FIG. 12, a bottom surface of the supporting column Pi is bonded and fixed to an upper surface of the substrate B with use of a resin R1. Further, the side surface of the collimating lens Ci which side surface is on an x-axis negative direction side is bonded and fixed, with use of a resin R2, to the side surface of the supporting column Pi which side surface is on an x-axis positive direction side.

On an optical path of a laser beam whose divergence in an F-axis direction has been collimated by the collimating lens Ci, a double mirror Mi is provided. As illustrated in FIG. 9, the double mirror Mi is constituted by (i) a first mirror Mi1 which is mounted on the upper surface of the substrate B and has a lower surface bonded and fixed to the upper surface of the substrate B and (ii) a second mirror Mi2 which is mounted on an upper surface of the first mirror Mi1 and has a lower surface bonded and fixed to the upper surface of the first mirror Mi1. The first mirror Mi1 has a reflective surface whose normal vector and the z-axis positive direction make an angle of 45° in a coordinate system illustrated in FIG. 9. The first mirror Mi1 reflects a laser beam collimated by a corresponding collimating lens among the laser beams constituting the first beam bundle, so as to (i) change a traveling direction of the laser beam from the y-axis positive direction to the z-axis positive direction and (ii) change a direction of an F axis of the laser beam from a direction parallel to the z axis to a direction parallel to the y axis. The second mirror Mi2 has a reflective surface whose normal vector and the z-axis positive direction make an angle of 135° in the coordinate system illustrated in FIG. 9. The second mirror Mi2 reflects a laser beam that has been reflected by a corresponding first mirror Mi1 so as to (i) change a traveling direction of the laser beam from the z-axis positive direction to a substantially x-axis positive direction and (ii) change a direction of an S axis of the laser beam from a direction parallel to the x axis to a direction parallel to a z axis. The double mirror Mi allows (a) causing a traveling direction of a laser beam reflected by the second mirror Mi2 to be changed in an elevation angle direction by adjusting an orientation of the first mirror Mi1 (by causing minute rotation of the first mirror Mi1 around the z axis as a rotation axis) and (b) causing a traveling direction of a laser beam reflected by the second mirror Mi2 to be changed in an azimuth direction by adjusting an orientation of the second mirror Mi2 (by causing minute rotation of the second mirror Mi2 around the z axis as a rotation axis). Accordingly, even in a case where the laser diodes LD1 through LDn are mounted at a shifted position or in a shifted direction, a traveling direction of a laser beam reflected by the second mirror Mi2 can be easily adjusted into a desired direction.

The double mirrors M1 through Mn are provided so that an optical path length li from each laser diode LDi to a corresponding double mirror Mi satisfies the following relation: l1<l2< . . . <ln. Laser beams reflected by second mirrors M12 through Mn2 constitute a beam bundle (hereinafter, "second beam bundle") consisting of laser beams whose optical axes are aligned in a plane (hereinafter, "second plane") parallel to the x-y plane and whose F axes are parallel to the x-y plane (parallel to the second plane). That is, the group of mirrors M converts the first beam bundle, which consists of laser beams whose optical axes are aligned in the first plane parallel to the x-y plane and whose F axes are orthogonal to the first plane, into the second beam bundle, which consists of laser beams whose optical axes are aligned in the second plane parallel to the x-y plane and whose F axes are parallel to the second plane. Note that whether the second beam bundle obtained by the group of mirrors M is a parallel bundle, a convergent bundle, or a divergent bundle depends on, for example, orientations of the second mirrors M12 through Mn2. In one or more embodiments, the orientations of the second mirrors M12 through Mn2 are determined so that the second beam bundle constitutes a convergent bundle, as with the laser module disclosed in Patent Literature 3. Note that the second plane is a virtual plane containing the optical axes of the laser beams outputted from the second mirrors M12 through Mn2, and is not a physical entity.

On optical paths of the second beam bundle obtained with use of the group of mirrors M, the converging lens L is provided. The converging lens L is a configuration for converging the second beam bundle by refracting, in the second plane, the laser beams constituting the second beam bundle. In one or more embodiments, the converging lens L is a plano-convex cylindrical lens that is provided so that, in the coordinate system illustrated in FIG. 1, a curved surface (incident surface) faces the x-axis negative direction, a flat surface (exit surface) faces the x-axis positive direction, and an outer edge of a cross section parallel to the x-y plane which outer edge is on an x-axis negative direction side forms an arc. Accordingly, the converging lens L has not only a function of converging the second beam bundle but also a function of collecting laser beams constituting the second beam bundle so that an F-axis diameter of each of the laser beams gradually decreases.

Since the second beam bundle constitutes a convergent bundle at a portion where the second beam bundle has not been converged by the converging lens L, laser beams constituting the second beam bundle at a portion where the second beam bundle has been converged by the converging lens L intersect with one another at a single point. The point at which the laser beams constituting the second beam bundle at the portion where the second beam bundle has been converged by the converging lens L intersect with one another will hereinafter be referred to as a beam intersection. At the beam intersection, an entrance end surface of the optical fiber OF is provided. The optical fiber OF is provided so that the entrance end surface faces the x-axis negative direction. The second beam bundle, after being converged by the converging lens L, enters the optical fiber OF via the entrance end surface.

Note that on an optical path of a laser beam extending from each collimating lens Ci to a corresponding double mirror Mi, a collimating lens may be provided for collimating a divergence of the laser beam in an S-axis direction. Further, on optical paths of a second beam bundle extending from the converging lens L to the optical fiber OF, a light collecting lens may be provided for allowing laser beams constituting the second beam bundle to be collected so that an S-axis diameter of each of the laser beams gradually decreases. This makes it possible to maintain a high efficiency of coupling between the group of laser diodes LD and the optical fiber OF, even in a case where a laser beam generated by each laser diode LDi has a wide divergence angle in an S-axis direction.

Note that although one or more embodiments may employ a configuration in which the second mirror Mi2 of each double mirror Mi is a mirror whose outer surface serves as a reflective surface, the present invention is not limited to this. That is, the second mirror Mi2 of each double mirror Mi may be a prism whose inner surface serves as a reflective surface. In this case, a laser beam reflected by the first mirror Mi1 enters the prism, is totally reflected by the inner surface (an interface between the prism and the air) of the prism, and then exits to an outside of the prism.

Features and Effect of Laser Module

Figure 2:
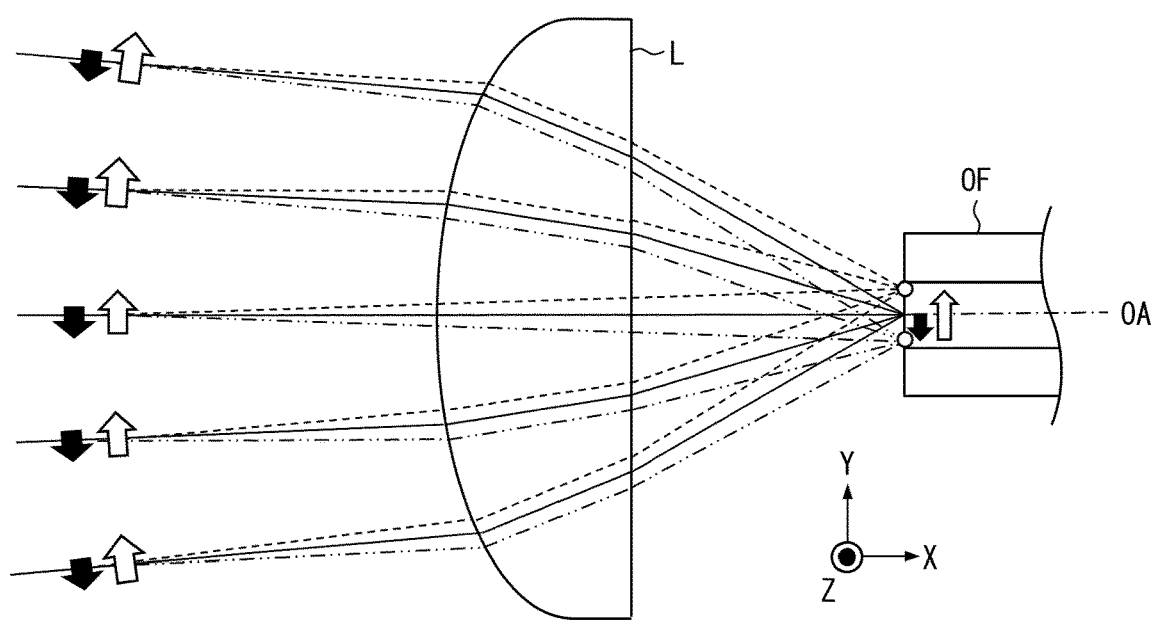
FIG. 2 is a plan view of a collimating lens and an optical fiber, which are included in the laser module illustrated in FIG. 1, in accordance with one or more embodiments of the present invention.
Figure 3:
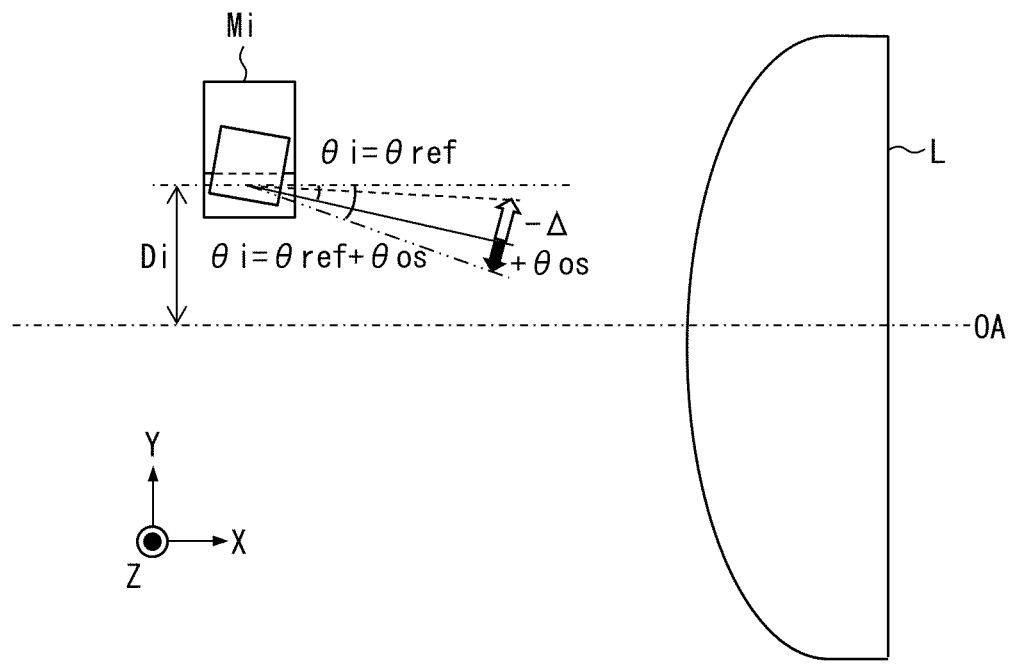
FIG. 3 is a plan view of a double mirror and a collimating lens, which are included in the laser module illustrated in FIG. 1, in accordance with one or more embodiments of the present invention.

The following description will discuss, with reference to FIGS. 2 and 3, features of the laser module 1. FIG. 2 is a plan view of the converging lens L and the optical fiber OF which are included the laser module 1. FIG. 3 is a plan view of the double mirror Mi and the converging lens L which are included in the laser module 1.

In the laser module 1, traveling directions of laser beams constituting the second beam bundle at a portion where the second beam bundle has not been converged by the converging lens L are set as illustrated in FIG. 2 in a dry state. That is, a traveling direction of each laser beam constituting the second beam bundle at a portion where the second beam bundle has not been converged by the converging lens L is offset from a reference direction so as to compensate for a change in the traveling direction caused by water absorption and expansion of the resins R1 and R2 used for fixing the collimating lenses C1 through Cn. Note that a reference direction means a traveling direction of each laser beam constituting the second beam bundle at a portion where the second beam bundle has not been converged by the converging lens L which traveling direction is such a direction as to cause laser beams constituting the second beam bundle at a portion where the second beam bundle has been converged by the converging lens L to form a single intersection on an optical axis OA of the converging lens L. In FIG. 2, a solid line indicates an optical path of a laser beam traveling in a reference direction and a two-dot chain line indicates an optical path of a laser beam traveling in a direction offset from a reference direction. In a case where the resins R1 and R2 used for fixing the collimating lens Ci have expanded by absorbing water, laser beams constituting the second beam bundle follow optical paths indicated by broken lines in FIG. 2.

In other words, the above feature is that, in the laser module 1, a propagation angle $\theta i$ of each laser beam constituting the second beam bundle at a portion where the second beam bundle has not been converged by the converging lens L (an angle between a traveling direction of the each laser beam and the optical axis OA of the converging lens L) is set as illustrated in FIG. 3 in a dry state. That is, the propagation angle $\theta i$ of the each laser beam constituting the second beam bundle at the portion where the second beam bundle has not been converged by the converging lens L is set to a value $\theta ref + \theta os$ (i.e., a reference angle $\theta ref$ plus an offset angle $\theta os$) so as to compensate for a change—$\Delta$ of the propagation angle $\theta i$ caused by water absorption and expansion of the resins R1 and R2 used for fixing the collimating lenses C1 through Cn. Note that a reference angle $\theta ref$ means a propagation angle $\theta i$ of each laser beam constituting the second beam bundle at a portion where the second beam bundle has not been converged by the converging lens L which propagation angle $\theta i$ is such an angle as to cause laser beams constituting the second beam bundle at a portion where the second beam bundle has been converged by the converging lens L to form a single intersection on the optical axis OA of the converging lens L. In FIG. 3, too, a solid line indicates an optical path of a laser beam traveling in a reference direction ($\theta i = \theta ref$) and a two-dot chain line indicates an optical path of a laser beam traveling in a direction offset from the reference direction ($\theta i = \theta ref + \theta os$). In a case where the resins R1 and R2 used for fixing the collimating lens Ci have expanded by absorbing water, each of the laser beams constituting the second beam bundle follows an optical path indicated by a broken line in FIG. 3. Offset angles $\theta ref$ (corresponding to "offset amounts" in the claims) for the respective laser beams are all positive or all negative. As a position at which a laser beam enters the converging lens L becomes farther from the optical axis of the converging lens L, an offset angle $\theta ref$ for the laser beam becomes smaller.

The following explains the reason why an offset angle $\theta ref$ for a laser beam becomes smaller as a position at which the laser beam enters the converging lens L becomes farther from the optical axis of the converging lens L. Consider a laser beam A that enters the converging lens L at a position far from the optical axis of the converging lens L and a laser beam B that enters the converging lens L at a position close to the optical axis of the converging lens L. A distance from the optical axis of the converging lens L to the laser beam A on a principal plane (a plane that contains a principal point and is orthogonal to the optical axis) of the converging lens L is defined as a, and a distance from the optical axis of the converging lens L to the laser beam B on the principal plane of the converging lens L is defined as b (a>b). The laser beam A and the laser beam B are located on the same side with respect to the optical axis of the converging lens L. Both before and after the water absorption and expansion, the laser beam A and the laser beam B intersect with each other on a plane that is parallel to the principal plane of the converging lens L and is away from the principal plane of the converging lens L by a distance f. During a course of expansion of the resins R1 and R2 due to water absorption, an intersection between the laser beam A and the laser beam B moves, within a plane containing the optical axes of the laser beam A and the laser beam B, in a direction parallel to the principal plane of the converging lens L. A distance from an intersection before the water absorption and expansion (before moving) to an intersection after the water absorption and expansion (after moving) is defined as d (b>d). When the relation: a, b>>f is taken into consideration, an offset angle $\theta A$ for the laser beam A at a portion where the laser beam A has passed through the converging lens L is given by the following formula: $\theta A = \tan^{-1}(a/f) - \tan^{-1}((a-d)/f) \approx (a/f) - (\frac{1}{3})(a/f)^3 - \{(a-d)/f - (\frac{1}{3})((a-d)/f)^3\} = d/f + \{d/(3f^3)\}(-3a^2 + 3ad - d^2)$, and an offset angle $\theta B$ for the laser beam B at a portion where the laser beam B has passed through the converging lens L is given by the following formula: $\theta B = \tan^{-1}(b/f) - \tan^{-1}((b-d)/f) \approx d/f + \{d/(3f^3)\}(-3b^2 + 3bd - d^2)$. Therefore, $\theta A - \theta B \approx (d/f^3)(-a^2 + ad + b^2 - bd) = (d/f^3)\{(a-b)d - (a+b)(a-b)\} = (d/f^3)(a-b)(d-a-b)$. When the relation: a>b>>d is taken into consideration, it follows that $\theta A - \theta B < 0$, that is, $\theta A < \theta B$. This means that as a position at which a laser beam enters the converging lens L becomes farther from the optical axis of the converging lens L, an offset angle for the laser beam at a portion where the laser beam has passed through the converging lens L becomes smaller. Needless to say, this relationship is also true of an offset angle $\theta os$ for a laser beam at a portion where the laser beam has not entered the converging lens L.

An example of a setting of a propagation angle $\theta i$ of each laser beam constituting the second beam bundle at a portion where the second beam bundle has not been converged by the converging lens L is shown in Table 1. Table 1 shows, for each laser beam constituting the second beam bundle at a portion where the second beam bundle has not been converged by the converging lens L, (i) a reference sign of a LD that serves as a light source of the laser beam (see FIG. 1), (ii) a propagation angle $\theta i$ of the laser beam (see FIG. 3), and (iii) a distance Di from the optical axis OA of the converging lens L to a position at which the laser beam is reflected (see FIG. 3). In manufacture of the laser module 1, orientations of the second mirrors M12 through Mn2 of the double mirrors M1 through Mn may be set so that, in a dry state, a propagation angle $\theta i$ of each laser beam constituting the second beam bundle at a portion where the second beam bundle has not been converged by the converging lens L has a value shown in Table 1.

TABLE 1

| LD reference sign | θi (deg) | Di (mm) |
|---|---|---|
| LD10 | −0.430 | −3.761 |
| LD9 | −0.350 | −2.897 |
| LD8 | −0.250 | −2.050 |
| LD7 | −0.150 | −1.218 |
| LD6 | −0.045 | −0.402 |
| LD5 | 0.065 | 0.398 |
| LD4 | 0.175 | 1.182 |
| LD3 | 0.275 | 1.950 |
| LD2 | 0.367 | 2.703 |
| LD1 | 0.450 | 3.439 |

Figure 4:
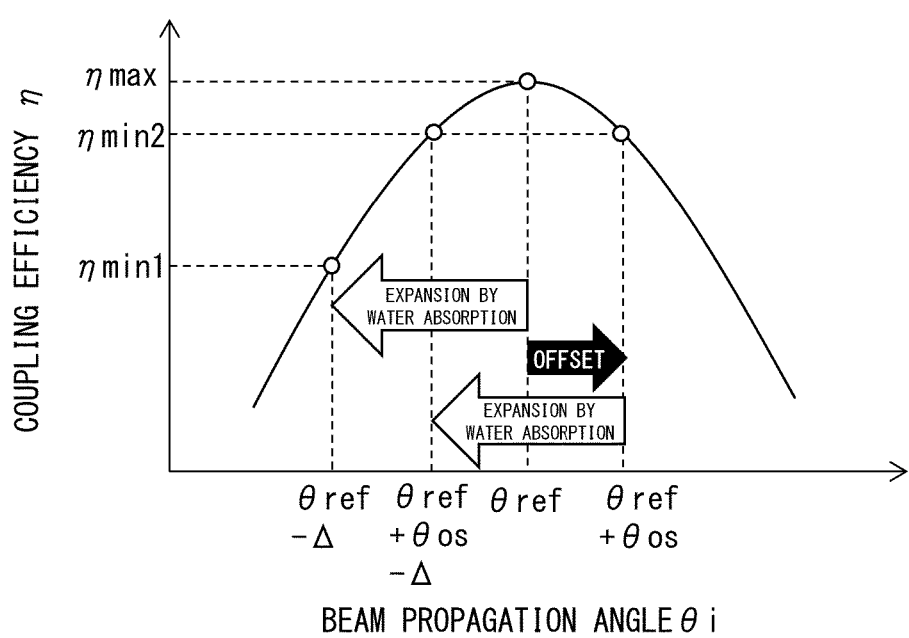
FIG. 4 is a graph concerning the laser module illustrated in FIG. 1, in which graph an efficiency of coupling between a laser beam constituting a second beam bundle and an optical fiber is represented as a function of a propagation angle of the laser beam, in accordance with one or more embodiments of the present invention.

The following description will discuss, with reference to FIG. 4, an effect of the laser module 1. FIG. 4 is a graph in which an efficiency η of coupling between a laser beam constituting the second beam bundle and the optical fiber OF is represented as a function of a propagation angle (a propagation angle of the laser beam at a portion where the laser beam has not entered the converging lens L) $\theta i$ of the laser beam.

In a case where a propagation angle $\theta i$ in a dry state is set to a reference angle $\theta ref$ as in the conventional laser module 20, an efficiency η of coupling decreases to ηmin1 when the resins R1 and R2 have expanded by absorbing water, as shown in FIG. 4. In contrast, in a case where a propagation angle $\theta i$ in a dry state is set to $\theta ref+\theta os$ (i.e., a reference angle $\theta ref$ plus an offset angle $\theta os$) as in the laser module 1 in accordance with one or more embodiments, an efficiency η of coupling is maintained at ηmin2>ηmin1 when the resins R1 and R2 have expanded by absorbing water, as shown in FIG. 4. Thus, a minimum efficiency ηmin2 of coupling achieved in a case where a propagation angle $\theta i$ in a dry state is set to $\theta ref+\theta os$ as in the laser module 1 in accordance with one or more embodiments is higher than a minimum efficiency ηmin1 of coupling achieved in a case where a propagation angle $\theta i$ in a dry state is set to $\theta ref$ as in the conventional laser module 20.

Note that an offset angle $\theta os$ may be set so that a rate $\{\eta(\theta ref)-\eta(\theta ref+\theta os)\}/\eta(\theta ref)\times 100$ of decrease, caused by an offset, in efficiency η of coupling is less than 1%. This allows maintaining a high value of the efficiency η of coupling in a dry state.

Thus, since the laser module 1 in accordance with one or more embodiments is configured such that a traveling direction of each laser beam constituting the second beam bundle at a portion where the second beam bundle has not been converged by the converging lens L is set as described above, the laser module 1 brings about an advantageous effect that a decrease in efficiency of coupling between the group of laser diodes LD and the optical fiber OF, which decrease may be caused in a case where the resins R1 and R2 used for fixing the collimating lens Ci have expanded by absorbing water, is reduced as compared with a conventional laser module.

Modified Example 1 of Laser Module

Figure 5:
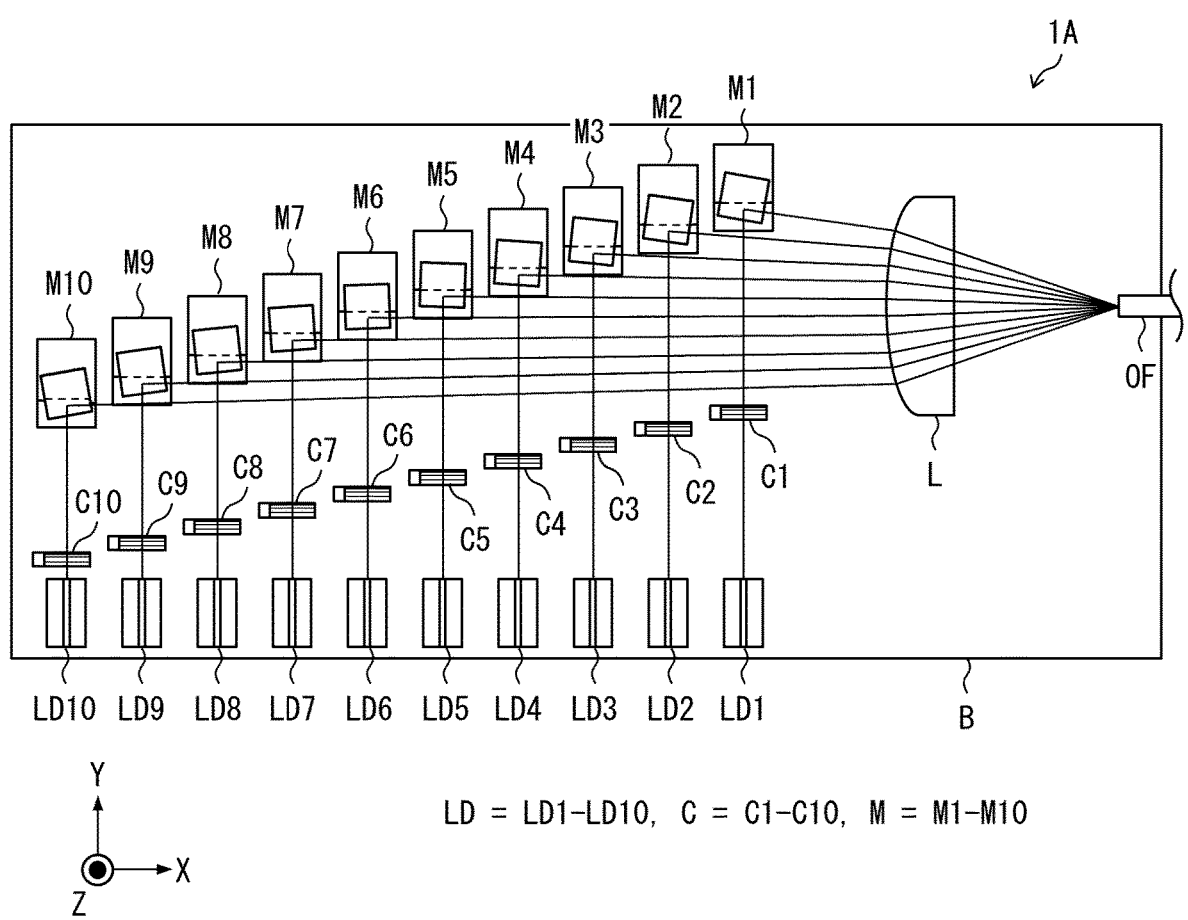
FIG. 5 is a plan view illustrating Modified Example 1 of the laser module illustrated in FIG. 1 in accordance with one or more embodiments of the present invention.

The following description will discuss, with reference to FIG. 5, Modified Example 1 of the laser module 1. FIG. 5 is a plan view illustrating a laser module 1A in accordance with Modified Example 1.

In the laser module 1 illustrated in FIG. 1, a distance from an exit end surface of each laser diode LDi to an entrance end surface of a corresponding collimating lens Ci is constant. In contrast, in the laser module 1A illustrated in FIG. 5, a distance from an exit end surface of each laser diode LDi to an entrance end surface of a corresponding collimating lens Ci varies. More specifically, a laser diode LDi with a longer optical path to a beam intersection has a shorter distance to a corresponding collimating lens Ci, and a laser diode LDi with a shorter optical path to a beam intersection has a longer distance to a corresponding collimating lens Ci. This is for allowing a beam diameter in an F-axis direction of a laser beam generated by each laser diode LDi to be minimized at a beam intersection.

It is possible, also in the laser module 1A in accordance with Modified Example 1, to allow a decrease in efficiency of coupling between a group of laser diodes and an optical fiber, which decrease may be caused in a case where a resin for fixing a collimating lens has expanded by absorbing water, to be reduced as compared with a conventional laser module. In addition, since the laser module 1A in accordance with Modified Example 1 employs a configuration in which a distance from an exit end surface of each laser diode LDi to an entrance end surface of a corresponding collimating lens Ci is set as described above, it is possible to maintain a high efficiency of coupling between the group of laser diodes LD and an optical fiber OF even in a case where a laser beam generated by each laser diode LDi has a large F-axis diameter.

Modified Example 2 of Laser Module

The following description will discuss, with reference to FIG. 6, Modified Example 2 of the laser module 1. (a) of FIG. 6 is a plan view illustrating a laser module 1B in accordance with Modified Example 2, and (b) of FIG. 6 is a side view of the laser module 1B in accordance with Modified Example 2.

In the laser module 1 illustrated in FIG. 1, the upper surface of substrate B, on which upper surface the laser diodes LD1 through LDn are mounted, is a flat surface. In contrast, in the laser module 1B illustrated in FIG. 6, an upper surface of a substrate B, on which upper surface laser diodes LD1 through LDn are provided, has a stepped shape. In the laser module 1B illustrated in FIG. 6, the laser diodes LD1 through LDn are mounted on the respective steps of the substrate B, one laser diode per step. For example, a laser diode LD10 is mounted on a highest step of the substrate B, a laser diode LD9 is mounted on a second highest step of the substrate B, and a laser diode LD8 is mounted on a third highest step of the substrate B. Accordingly, the farther a laser diode LDi is located from a converging lens L, the higher the laser diode LDi is located. In terms of a coordinate system illustrated in FIG. 6, the smaller a value of an x coordinate of a position of a LDi, the greater a value of a z coordinate of the position. A laser beam outputted from each laser diode LDi is collimated by a collimating lens Ci provided on the same step of the substrate B as the each laser diode LDi. As with the configuration illustrated in FIG. 1, a side surface of each collimating lens Ci is bonded and fixed to a side surface of a supporting column Pi (reference signs of the supporting columns are omitted in FIG. 6) and a bottom surface of the supporting column Pi is bonded and fixed to a corresponding step of the upper surface of the substrate B.

Further, while the laser module 1 illustrated in FIG. 1 includes the group of mirrors M that are constituted by the double mirrors M1 through Mn each having at least two reflective surfaces, the laser module 1B illustrated in FIG. 6 includes a group of mirrors M that are constituted by mirrors M1 through Mn each having at least one reflective surface. In the laser module 1B illustrated in FIG. 6, the mirrors M1 through Mn stand upright on the respective steps of the substrate B, one mirror per step. For example, a mirror M10 stands on a highest step of the substrate B, a mirror M9 stands on a second highest step of the substrate B, and a mirror M8 stands on a third highest step of the substrate B. Each mirror Mi reflects a laser beam, which is outputted from a laser diode LDi mounted on the same step of the substrate B as the each mirror Mi, so as to change a traveling direction of the laser beam from a y-axis positive direction to a direction parallel to a z-x plane. A second beam bundle constituted by laser beams reflected by the respective mirrors Mi is converged by the converging lens L mounted on the substrate B.

In the laser module 1B illustrated in FIG. 6, traveling directions of laser beams constituting the second beam bundle at a portion where the second beam bundle has not been converged by the converging lens L are set as illustrated in FIG. 7 in a dry state. That is, a traveling direction of each laser beam constituting the second beam bundle at a portion where the second beam bundle has not been converged by the converging lens L is offset from a reference direction so as to compensate for a change in the traveling direction caused by water absorption and expansion of the resins R1 and R2 used for fixing the collimating lenses C1 through Cn. Note that a reference direction means a traveling direction of each laser beam constituting the second beam bundle at a portion where the second beam bundle has not been converged by the converging lens L which traveling direction is such a direction as to cause laser beams constituting the second beam bundle at a portion where the second beam bundle has been converged by the converging lens L to form a single intersection on an optical axis OA of the converging lens L. In FIG. 7, a solid line indicates an optical path of a laser beam traveling in a reference direction and a two-dot chain line indicates an optical path of a laser beam traveling in a direction offset from a reference direction. In a case where the resins R1 and R2 used for fixing the collimating lens Ci have expanded by absorbing water, each of the laser beams constituting the second beam bundle follows an optical path indicated by a broken line in FIG. 7. Note that in the laser module 1B illustrated in FIG. 6, setting of traveling directions of laser beams constituting the second beam bundle at a portion where the second beam bundle has not been converged by the converging lens L is made by adjusting inclinations of the respective mirrors M1 through Mn.

The laser module 1B illustrated in FIG. 6 brings about the same effect as that of the laser module 1 illustrated in FIG. 1. In addition, the laser module 1B illustrated in FIG. 6 has an advantageous effect that, due to having a simpler configuration of the group of mirrors M as compared with that of the laser module 1 illustrated in FIG. 1, the laser module 1B can be manufactured more easily and inexpensively than the laser module 1 illustrated in FIG. 1. Furthermore, it is possible to provide the laser module 1B having a simpler configuration than that of the laser module 1 illustrated in FIG. 1. In the configuration employed in FIG. 6, (i) a difference in height between each step and a step adjacent to the each step of the upper surface of the substrate B and (ii) a width of the each step are uniform among the steps of the upper surface of the substrate B so that the laser diodes LD1 through LD10 are provided at equal intervals in an x-axis direction and a z-axis direction. However, the present embodiment is not limited to this. That is, it is possible to employ a configuration in which (i) a difference in height between each step and a step adjacent to the each step of the upper surface of the substrate B or (ii) a width of the each step varies among the steps of the upper surface of the substrate B so that the laser diodes LD1 through LD10 are provided at irregular intervals in the x-axis direction and the z-axis direction.

Recap

A light-guiding device in accordance with one or more embodiments is a light-guiding device, including: a group of mirrors (M) that converts a first beam bundle consisting of a plurality of laser beams into a second beam bundle consisting of a plurality of laser beams; a group of collimating lenses (C) provided at a stage previous to the group of mirrors (M) and consisting of collimating lenses (C1 through Cn) each of which collimates a divergence, in an F-axis direction, of a corresponding one of the plurality of laser beams constituting the first beam bundle; and a converging lens (L) provided at a stage subsequent to the group of mirrors (M), the converging lens (L) converging the second beam bundle by refracting each of the plurality of laser beams constituting the second beam bundle, a traveling direction of each of laser beams constituting the second beam bundle at a portion where the second beam bundle has not been converged by the converging lens (L) being given an offset so as to be offset from a reference direction so as to compensate for a change in the traveling direction caused by an expansion of a resin (R1, R2) for fixing the collimating lenses (C1 through Cn), the reference direction being such a traveling direction of the each of the laser beams constituting the second beam bundle at the portion where the second beam bundle has not been converged by the converging lens (L) as to cause a plurality of laser beams constituting the second beam bundle at a portion where the second beam bundle has been converged by the converging lens (L) to form a single intersection on an optical axis of the converging lens (L).

The light-guiding device in accordance with one or more embodiments may be configured such that the traveling direction of the each of the laser beams constituting the second beam bundle at the portion where the second beam bundle has not been converged by the converging lens (L) is offset from the reference direction so that offset amounts of propagation angles of the respective laser beams are all positive or all negative.

The light-guiding device in accordance with one or more embodiments may be configured such that the traveling direction of the each of the laser beams constituting the second beam bundle at the portion where the second beam bundle has not been converged by the converging lens (L) is offset from the reference direction so that an offset amount of a propagation angle of the each of the laser beams becomes wider as a position at which the each of the plurality of laser beams enters the converging lens (L) becomes farther from the optical axis of the converging lens (L).

The light-guiding device in accordance with one or more embodiments may be configured such that the first beam bundle consists of laser beams whose optical axes are aligned in a first plane and whose F axes intersect with the first plane; and the second beam bundle consists of laser beams whose optical axes are aligned in a second plane and whose F axes extend along the second plane.

The light-guiding device in accordance with one or more embodiments may be configured such that the light-guiding device further includes: a substrate (B) having an upper surface parallel to the first plane; and a group of supporting columns (P) consisting of supporting columns (Pi) each of which supports a corresponding one of the collimating lenses (Ci) constituting the group of collimating lenses (C) and has (i) a side surface to which a side surface of the corresponding one of the collimating lenses (Ci) is bonded and fixed and (ii) a bottom surface which is bonded and fixed to an upper surface of the substrate (B), the resin (R1, R2) being a resin (R1) for bonding and fixing the supporting columns (Pi) to the substrate (B) and a resin (R2) for bonding and fixing the collimating lenses (Ci) to the supporting columns (Pi).

The light-guiding device in accordance with one or more embodiments may be configured such that the group of mirrors (M) consists of double mirrors (Mi) each of which includes (i) a first mirror (Mi1) that reflects a corresponding one of the plurality of laser beams constituting the first beam bundle and (ii) a second mirror (Mi2) that reflects a laser beam reflected by the first mirror (Mi1); each of the double mirrors (Mi) constituting the group of mirrors (M) is independent of the other one or more double mirrors (Mj) constituting the group of mirrors (M); and the second beam bundle consists of laser beams each of which has been reflected by the second mirror (Mi2) of a corresponding one of the double mirrors (Mi) constituting the group of mirrors (M).

The light-guiding device in accordance with one or more embodiments may be configured such that the first beam bundle consists of laser beams whose optical axes extend along a first axis (the y axis in FIG. 6) and whose F axes extend along a second axis (the z axis in FIG. 6) orthogonal to the first axis; and the second beam bundle consists of laser beams whose optical axes are aligned in a plane (the x-z plane in FIG. 6) orthogonal to the first axis and whose F axes extend along the plane.

The light-guiding device in accordance with one or more embodiments may be configured such that the light-guiding device further includes: a substrate (B) having an upper surface that has a stepped shape constituted by steps, on each of which a light source of a corresponding one of the laser beams constituting the first beam bundle is mounted; and a group of supporting columns (P) consisting of supporting columns (Pi) each of which supports a corresponding one of the collimating lenses (Ci) constituting the group of collimating lenses (C) and has (i) a side surface to which a side surface of the corresponding one of the collimating lenses (Ci) is bonded and fixed and (ii) a bottom surface which is bonded and fixed to a corresponding one of the steps of the upper surface of the substrate (B), the resin (R1, R2) being a resin (R1) for bonding and fixing the supporting columns (Pi) to the substrate (B) and a resin (R2) for bonding and fixing the collimating lenses (Ci) to the supporting columns (Pi).

The light-guiding device in accordance with one or more embodiments may be configured such that the traveling direction of the each of the laser beams constituting the second beam bundle at the portion where the second beam bundle has not been converged by the converging lens (L) is set so that extensions of optical axes of the laser beams constituting the second beam bundle at the portion where the second beam bundle has not been converged by the converging lens (L) form a single intersection on an exit side of the converging lens (L).

The light-guiding device in accordance with one or more embodiments may be configured such that a distance between each of the collimating lenses (Ci) constituting the group of collimating lenses (C) and a light source of a laser beam collimated by the each of the collimating lenses (Ci) is set so that an F-axis diameter of the laser beam collimated by the each of the collimating lenses (Ci) is minimum at the single intersection.

A laser module (1, 1A, 1B) in accordance with one or more embodiments is a laser module including: the light-guiding device; a group of laser diodes (LD) consisting of laser diodes (LD1 through LDn) which output the respective plurality of laser beams constituting the first beam bundle; and an optical fiber (OF) to which the second beam bundle is inputted.

The laser module (1, 1A, 1B) in accordance with one or more embodiments may be configured such that the traveling direction of each of the laser beams constituting the second beam bundle at the portion where the second beam bundle has not been converged by the converging lens (L) is set so that a rate of decrease, caused by the offset, in efficiency of coupling with the optical fiber (OF) is less than 1%.

A method, in accordance with one or more embodiments, for manufacturing a light-guiding device is a method for manufacturing a light-guiding device, the light-guiding device including: a group of mirrors (M) that converts a first beam bundle consisting of a plurality of laser beams into a second beam bundle consisting of a plurality of laser beams; a group of collimating lenses (C) provided at a stage previous to the group of mirrors (M) and consisting of collimating lenses (C1 through Cn) each of which collimates a divergence, in an F-axis direction, of a corresponding one of the plurality of laser beams constituting the first beam bundle; and a converging lens (L) provided at a stage subsequent to the group of mirrors (M), the converging lens (L) converging the second beam bundle by refracting each of the plurality of laser beams constituting the second beam bundle, the method including the step of: giving an offset to a traveling direction of each of laser beams constituting the second beam bundle at a portion where the second beam bundle has not been converged by the converging lens (L), so that the traveling direction is offset from a reference direction so as to compensate for a change in the traveling direction caused by an expansion of a resin (R1, R2) for fixing the collimating lenses (C1 through Cn), the reference direction being such a direction of the each of laser beams constituting the second beam bundle at the portion where the second beam bundle has not been converged by the converging lens (L) as to cause a plurality of laser beams constituting the second beam bundle at a portion where the second beam bundle has been converged by the converging lens (L) to form a single intersection on an optical axis of the converging lens (L).

Supplementary Note

The present invention is not limited to the description of the embodiments above, but may be altered as appropriate by a skilled person within the scope of the claims. That is, the present invention encompasses embodiments based on a proper combination of technical means modified as appropriate within the scope of the claims.

For example, the descriptions of the embodiments above have discussed a configuration in which a traveling direction, in a dry state (e.g., a lower limit value of a humidity range predetermined as an operation condition), of each laser beam constituting the second beam bundle at a portion where the second beam bundle has not been converged by the converging lens is offset so as to compensate for a change in the traveling direction caused by water absorption and expansion of a resin used for fixing the collimating lenses. However, the present invention is not limited to this. For example, the scope of the present invention encompasses a configuration in which a traveling direction, in a low temperature state (e.g., a lower limit value of a temperature range predetermined as an operation condition), of each laser beam constituting the second beam bundle at a portion where the second beam bundle has not been converged by the converging lens is offset so as to compensate for a change in the traveling direction caused by expansion, due to heating, of a resin used for fixing the collimating lenses.

Further, although the descriptions of the embodiments above have discussed a configuration in which laser diodes provided on a flat substrate are used as light sources, the present invention is not limited to this. For example, the scope of the present invention encompasses a configuration in which laser diodes, which are provided on respective steps of a substrate having a stepped shape, are used as light sources. In this case, the collimating lenses are provided, for example, on the respective steps of the substrate so as to each face an exit end surface of a corresponding one of the laser diodes, and the mirrors are provided, for example, on the respective steps of the substrate so as to each face an exit end surface of a corresponding one of the laser diodes through a corresponding one of the collimating lenses. Laser beams reflected by the respective mirrors are aligned, for example, in a plane orthogonal to a bottom surface of the substrate, and the converging lens is provided, for example, on optical paths of the laser beams. The laser module 1B illustrated in FIG. 6 is an example of such a laser module.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST 1, 1B: Laser module
LD: Group of laser diodes
LD1 through LDn: Laser diode
C: Group of collimating lenses
C1 through Cn: Collimating lens
M: Group of mirrors
M1 through Mn: Double mirror
L: Converging lens
OF: Optical fiber

The invention claimed is:

1. A light-guiding device, comprising:
a group of mirrors that converts a first beam bundle comprising a plurality of first laser beams, each of which has an optical axis aligned in a first plane and an F axis that intersects with the first plane, into a second beam bundle comprising a plurality of second laser beams, each of which has an optical axis aligned in a second plane and an F axis that extends along the second plane;
a group of collimating lenses disposed at a stage previous to the group of mirrors and comprising collimating lenses that each collimate a divergence, in an F-axis direction, of a corresponding one of the plurality of first laser beams;
a converging lens disposed at a stage subsequent to the group of mirrors, the converging lens converges the second beam bundle by refracting each of the plurality of second laser beams;
a substrate having an upper surface parallel to the first plane; and
a group of supporting columns that each:
support a corresponding one of the collimating lens,
have a side surface to which a side surface of the corresponding one of the collimating lenses is bonded and fixed by a first resin, and
have a bottom surface that is bonded and fixed to an upper surface of the substrate by a second resin, wherein
a traveling direction of each of the plurality of second laser beams at a portion where the second beam bundle has not been converged is given an offset from a reference direction to compensate for a change in the traveling direction caused by an expansion of the first resin and the second resin, and
the reference direction is a traveling direction that causes the plurality of second laser beams at a portion where the second beam bundle has been converged by the converging lens to form a single intersection on an optical axis of the converging lens.

2. The light-guiding device as set forth in claim 1, wherein the traveling direction is offset from the reference direction so that offset amounts of propagation angles of the respective plurality of second laser beams are all positive or all negative.

3. The light-guiding device as set forth in claim 1, wherein the traveling direction is offset from the reference direction so that an offset amount of a propagation angle of each of the plurality of second laser beams becomes smaller as a position at which each of the plurality of second laser beams enters the converging lens becomes farther from the optical axis of the converging lens.

4. The light-guiding device as set forth in claim 1, wherein the group of mirrors comprises sets of double mirrors, each set of the double mirrors includes:
a first mirror that reflects a corresponding one of the plurality of first laser beams; and
a second mirror that reflects a laser beam reflected by the first mirror,
each set of the double mirrors is independent of the other one or more sets of the double mirrors, and
each of the plurality of second laser beams is reflected by the second mirror of a corresponding one of the sets of double mirrors.

5. The light-guiding device as set forth in claim 1, wherein the traveling direction is set so that extensions of optical axes of the plurality of second laser beams at the portion where the second beam bundle has not been converged form a single intersection on an exit side of the converging lens.

6. The light-guiding device as set forth in claim 1, wherein a distance between each of the collimating lenses and a light source of a laser beam collimated by the each of the collimating lenses is set so that an F-axis diameter of the laser beam collimated by the each of the collimating lenses is minimum at the single intersection.

7. A laser module comprising:
the light-guiding device recited in claim 1;
a group of laser diodes comprising laser diodes that each output a respective one of the plurality of first laser beams; and
an optical fiber into which the second beam bundle is inputted.

8. The laser module as set forth in claim 7, wherein the traveling direction is set so that a rate of decrease, caused by the offset, in efficiency of coupling with the optical fiber is less than 1%.

9. The light-guiding device as set forth in claim 1, wherein the first resin comprises a fillet portion attached to a lower surface of each of the collimating lenses.

10. The light-guiding device as set forth in claim 1, wherein
- a travelling direction of the first laser beams is a y-axis positive direction,
- a direction perpendicular to the substrate and that extends from a lower surface of the substrate toward the upper surface of the substrate is a z-axis positive direction,
- each of the collimating lenses is a plano-convex cylindrical lens with:
  - a flat surface that faces a y-axis negative direction opposite to the y-axis positive direction,
  - a curved surface that faces the y-axis positive direction, and
  - an arc comprising an outer edge of a cross section parallel to a y-z plane, wherein the outer edge is on the y-axis positive direction,
- a side surface of each of the collimating lenses is bonded and fixed to the side surface of a corresponding one of the supporting columns, and
- the side surface of each of the collimating lenses is neither the flat surface nor the curved surface.

11. A method for manufacturing a light-guiding device that comprises a group of mirrors that converts a first beam bundle comprising a plurality of first laser beams, each of which has an optical axis aligned in a first plane and an F axis that intersects with the first plane, into a second beam bundle comprising a plurality of second laser beams, each of which has an optical axis aligned in a second plane and an F axis that extends along the second plane, the method comprising:
- preparing a substrate having an upper surface parallel with the first plane;
- disposing, on the substrate;
- a group of collimating lenses at a stage previous to the group of mirrors, wherein the group comprises collimating lenses that each collimate a divergence, in an F-axis direction, of a corresponding one of the plurality of first laser beams;
- a converging lens at a stage subsequent to the group of mirrors, wherein the converging lens converges the second beam bundle by refracting each of the plurality of second laser beams;
- a group of supporting columns that each:
  - support a corresponding one of the collimating lenses,
  - have a side surface to which a side surface of the corresponding one of the collimating lenses is bound and fixed by a first resin, and
  - have a bottom surface that is bonded and fixed to an upper surface of the substrate by a second resin; and
- offsetting a traveling direction of each of the plurality of second laser beams at a portion where the second beam bundle has not been converged by a reference direction to compensate for a change in the traveling direction caused by an expansion of the first resin and the second resin, wherein
- the reference direction is a traveling direction that causes the plurality of second laser beams at a portion where the second beam bundle has been converged to form a single intersection on an optical axis of the converging lens.

* * * * *